(12) United States Patent
Daicho et al.

(10) Patent No.: US 8,994,051 B2
(45) Date of Patent: Mar. 31, 2015

(54) LIGHT EMISSION MODULE, LIGHT EMISSION MODULE MANUFACTURING METHOD, AND LAMP UNIT

(75) Inventors: Hisayoshi Daicho, Shizuoka (JP); Tatsuya Matsuura, Shizuoka (JP); Yasuaki Tsutsumi, Shizuoka (JP); Masanobu Mizuno, Shizuoka (JP); Shogo Sugimori, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 13/131,736

(22) PCT Filed: Nov. 25, 2009

(86) PCT No.: PCT/JP2009/006352
§ 371 (c)(1),
(2), (4) Date: May 27, 2011

(87) PCT Pub. No.: WO2010/061592
PCT Pub. Date: Jun. 3, 2010

(65) Prior Publication Data
US 2011/0284902 A1 Nov. 24, 2011

(30) Foreign Application Priority Data
Nov. 28, 2008 (JP) .................. 2008-305119

(51) Int. Cl.
*H01L 33/50* (2010.01)
*H01L 33/62* (2010.01)
(Continued)

(52) U.S. Cl.
CPC ............. *H01L 33/505* (2013.01); *F21S 48/115* (2013.01); *H01L 33/508* (2013.01); *H01L 33/60* (2013.01)

USPC ............... 257/98; 257/95; 257/99; 257/79; 257/81; 257/88; 257/91; 257/431; 257/432; 257/433

(58) Field of Classification Search
CPC ......... H01L 33/50; H01L 33/00; H01L 33/62; H01L 33/06
USPC ............. 257/98, 81, 88, 91, 95, 99, 431, 432, 257/433, 451
See application file for complete search history.

(56) References Cited

U.S. PATENT DOCUMENTS 5,813,752 A * 9/1998 Singer et al. ................ 362/293
2002/0163810 A1* 11/2002 West et al. .................. 362/307
(Continued)

FOREIGN PATENT DOCUMENTS

| CN | 1638166 A | 7/2005 |
| CN | 1644978 A | 7/2005 |

(Continued)

OTHER PUBLICATIONS

China Office Action, Sep. 18, 2012, 9 pages.
(Continued)

*Primary Examiner* — Chuong A Luu
(74) *Attorney, Agent, or Firm* — Buchanan Ingersoll & Rooney PC

(57) ABSTRACT

In a light emission module (40), a light wavelength conversion ceramic (52) is formed in a sheet shape which converts the wavelength of the light emitted from a semiconductor light emission element (48) when emitting the light. The light wavelength conversion ceramic (52) has a tapered plane (52*a*) which is inclined to approach the semiconductor light emission element (48) toward the brim portion. The light wavelength conversion ceramic (52) is transparent and is arranged so that the light emission wavelength band after the conversion has an all ray permeability of 40% or above.

14 Claims, 4 Drawing Sheets

(51) Int. Cl.
*F21S 8/10* (2006.01)
*H01L 33/60* (2010.01)

(56) References Cited

U.S. PATENT DOCUMENTS

| | | | | |
|---|---|---|---|---|
| 2006/0091411 | A1* | 5/2006 | Ouderkirk et al. | 257/98 |
| 2006/0091784 | A1* | 5/2006 | Conner et al. | 313/498 |
| 2007/0257270 | A1* | 11/2007 | Lu et al. | 257/98 |
| 2007/0284603 | A1* | 12/2007 | Haase | 257/98 |
| 2008/0116473 | A1* | 5/2008 | Sugiyama | 257/98 |
| 2010/0019265 | A1* | 1/2010 | Sormani et al. | 257/98 |
| 2011/0204405 | A1* | 8/2011 | Tsutsumi et al. | 257/98 |
| 2011/0210369 | A1* | 9/2011 | Daicho et al. | 257/98 |

FOREIGN PATENT DOCUMENTS

| | | | |
|---|---|---|---|
| CN | 101288342 | A | 10/2008 |
| EP | 1926154 | A2 | 5/2008 |
| JP | 2002533956 | A | 8/2002 |
| JP | 2006005367 | A | 1/2006 |
| JP | 2006501656 | A | 12/2006 |
| JP | 2007059864 | A | 3/2007 |
| JP | 2007208196 | A | 8/2007 |
| JP | 2007235103 | A | 9/2007 |
| JP | 2008153617 | A | 7/2008 |
| JP | 2008288221 | A | 11/2008 |
| WO | 2008078235 | A2 | 7/2008 |

OTHER PUBLICATIONS

ISA/JP, IPRP, ISR and Written Opinion with Translation in PCT International Application PCT/JP2009/006352, dated May 28, 2011.
European Search Report for corresponding European Patent Appln. No. 09828842.6 dated Jul. 29, 2013 (7 pages).
Chinese Office Action for corresponding Chinese Patent Appln. No. 200980147484.X dated Sep. 3, 2013, with English translation (14 pages).
Fourth Office Action issued on Mar. 12, 2014, by the Chinese Patent Office in corresponding Chinese Patent Application No. 200980147484X, and an English Translation of the Office Action. (17 pages).
CIPO, Office Action in counterpart Chinese Patent Application No. 200980147484X dated Apr. 7, 2013.
JPO, Office Action in counterpart Japanese Patent Application No. 2010-540370 dated May 7, 2013.

* cited by examiner

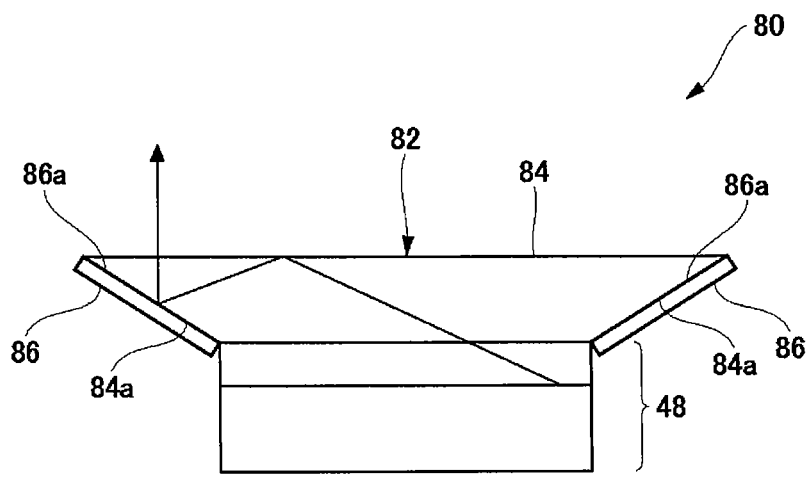
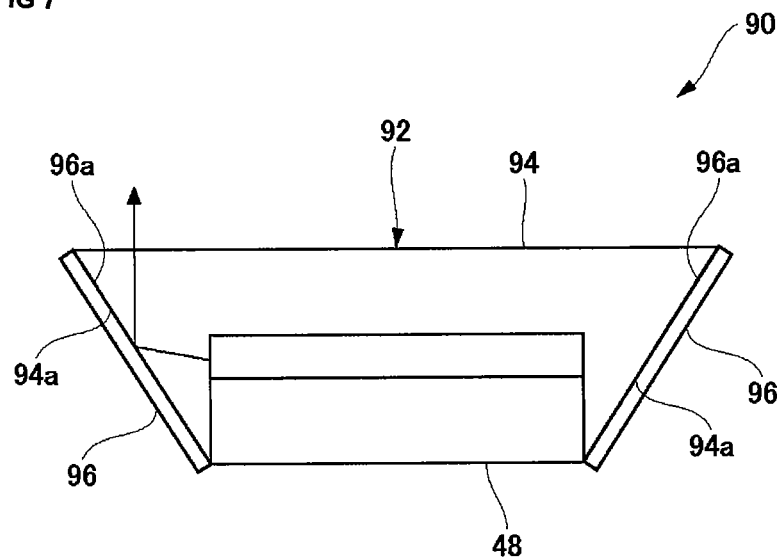

LIGHT EMISSION MODULE, LIGHT EMISSION MODULE MANUFACTURING METHOD, AND LAMP UNIT

CROSS-REFERENCES TO RELATED APPLICATIONS

This is a U.S. national phase of PCT/JP2009/006352, filed 25 Nov. 2009, claiming priority from Japanese Application No. JP2008-305119, filed 28 Nov. 2008.

FIELD OF THE INVENTION

The present invention relates to a light emitting module, a method of manufacturing the light emitting module, and a lamp unit comprising the light emitting module.

BACKGROUND ART

In recent years, for the purpose of long life or reduction in power consumption, a technique has been developed in which a light emitting module having a light emitting element, such as an LED (Light Emitting Diode), is adopted as a light source for emitting strong light, such as a lamp unit that emits light toward the front of a vehicle. However, the light emitting module to be used in such an application is required to have high luminance and high light intensity. Accordingly, in order to improve, for example, the extraction efficiency of white light, a lighting system comprising: a light emitting element that mainly emits blue light; a yellow phosphor that mainly emits yellow light by being excited with the blue light; and a blue-transmitting yellow-reflecting means that transmits the blue light from the light emitting element and reflects the light with a wavelength of the yellow light or more from the yellow phosphor, is proposed (see, for example, Patent Document 1).

However, when a wavelength of light is converted by using a general powdered phosphor, the light intensity of the light is weakened upon the light hitting the particles of the phosphor, and hence it is difficult to achieve a high use efficiency of light. Accordingly, a structure comprising a ceramic layer arranged within the channel of the light emitted by a light emitting layer is proposed (see, for example, Patent Document 2).

PATENT DOCUMENTS

[Patent Document 1] Japanese Patent Application Publication No. 2007-59864
[Patent Document 2] Japanese Patent Application Publication No. 2006-5367

DISCLOSURE OF THE INVENTION

Problem to be Solved by the Invention

Herein, FIG. 9 illustrates an example of the path of light in a light emitting module 200 in which light wavelength conversion ceramic 204 whose section has a rectangular shape is mounted on the upper surface of a semiconductor light emitting element 202. Part of the light emitted by the semiconductor light emitting element 202 travels obliquely. Such the light is reflected inside the emitting surface of the light wavelength conversion ceramic 204 and further reflected again inside the end surface of the light wavelength conversion ceramic 204, thereafter returning to the semiconductor light emitting element 202. As stated above, the light returning to the semiconductor light emitting element 202 is likely to be absorbed by the semiconductor light emitting element 202 as it is, thereby leading to a decrease in the use efficiency of light.

Accordingly, the present invention has been made in view of the aforementioned problem, and a purpose of the invention is to improve the use efficiency of light by a light wavelength conversion member in a light emitting module.

Means for Solving the Problem

In order to solve the aforementioned problem, a light emitting module according to an embodiment of the present invention comprises a light emitting element and a plate-shaped light wavelength conversion member configured to convert the wavelength of the light emitted by the light emitting element and to emit the light. The light wavelength conversion member has a tapered surface that slopes such that the thickness thereof is reduced toward the end portion thereof.

According to the embodiment, the light traveling toward the end portion can be efficiently emitted outside from the tapered surface. Thereby, the light that will return to the light emitting element by being reflected around the end portion can be reduced and the use efficiency of light can be improved.

The light wavelength conversion member may be transparent. According to the embodiment, a decrease in the light intensity, occurring when light is transmitting the inside of the light wavelength conversion member, can be suppressed. Accordingly, the light emitted by the light emitting element can be used efficiently.

The light wavelength conversion member may have 40 percent or more of the total light transmittance of the light with a wavelength within the converted light-emitting wavelength range. As a result of the intensive research and development by the inventors, it has been found that, when a light wavelength conversion member is so transparent that the total light transmittance of the light with a wavelength within the converted light-emitting wavelength range is 40 percent or more, proper conversion of the wavelength of light by the light wavelength conversion member and suppression of a decrease in the light intensity of the light that transmits the light wavelength conversion member can be both satisfied. Therefore, according to the embodiment, it becomes possible to properly convert the wavelength of the light that transmits a light wavelength conversion member while a decrease in the light intensity of the light is being suppressed.

The tapered surface may slope so as to be closer to the light emitting element toward the end portion. According to the embodiment, light can be efficiently emitted from the light wavelength conversion member in the same direction as that in which the light emitting element emits light.

Alternatively, the tapered surface may slope so as to be away from the light emitting element toward the end portion. In this case, the light emitting module may further comprise a reflective layer configured to reflect the light to be emitted from the light wavelength conversion member, which is provided on the tapered surface. In this embodiment, light can also be efficiently emitted from the light wavelength conversion member in the same direction as that in which the light emitting element emits light.

Another embodiment of the present invention is a method of manufacturing a light emitting module. The method comprises: providing a tapered surface on a plate-shaped light wavelength conversion member configured to convert the wavelength of the incident light and to emit the light, so that the thickness of the light wavelength conversion member is reduced toward the end portion thereof; and arranging a light emitting element and the light wavelength conversion member such that the light emitted by the light emitting element is to be incident in the light wavelength conversion member.

According to the embodiment, because a plate-shaped light wavelength conversion member is used, a tapered surface can be easily provided. Thereby, a light emitting module having a good use efficiency of light can be readily manufactured.

Still another embodiment of the present invention is a lamp unit. The lamp unit comprises: a light emitting module having a light emitting element and a plate-shaped light wavelength conversion member configured to convert the wavelength of the light emitted by the light emitting element and to emit the light; and an optical member configured to collect the light emitted from the light emitting module. The light wavelength conversion member has a tapered surface such that the thickness thereof is reduced toward the end portion thereof.

According to the embodiment, a lamp unit can be manufactured by using a light emitting module having a good use efficiency of light. Thereby, a lamp unit having a high luminance or high light intensity can be provided.

Advantage of the Invention

According to the present invention, a use efficiency of light by a light wavelength conversion member can be improved in a light emitting module.

BRIEF DESCRIPTION OF THE DRAWINGS

FIG. 6 is a view illustrating the configuration of a light emitting module according to a fourth embodiment;
FIG. 7 is a view illustrating the configuration of a light emitting module according to a fifth embodiment.

REFERENCE NUMERALS

40 LIGHT EMITTING MODULE
48 SEMICONDUCTOR LIGHT EMITTING ELEMENT
52 LIGHT WAVELENGTH CONVERSION CERAMIC
52A TAPERED SURFACE
60 LIGHT EMITTING MODULE
62 LIGHT WAVELENGTH CONVERSION CERAMIC
62A TAPERED SURFACE
70 LIGHT EMITTING MODULE
72 LIGHT WAVELENGTH CONVERSION CERAMIC
72A TAPERED SURFACE
74 TRANSPARENT CERAMIC
80 LIGHT EMITTING MODULE
82 CERAMIC UNIT
84 LIGHT WAVELENGTH CONVERSION CERAMIC
84A TAPERED SURFACE
86 REFLECTIVE LAYER
86A REFLECTIVE SURFACE
90 LIGHT EMITTING MODULE
92 CERAMIC UNIT
94 LIGHT WAVELENGTH CONVERSION CERAMIC
94A TAPERED SURFACE
96 REFLECTIVE LAYER
96A REFLECTIVE SURFACE
100 LIGHT EMITTING MODULES
102 TRANSPARENT CERAMIC
102A TAPERED SURFACE
104 CERAMIC UNIT
106 LIGHT WAVELENGTH CONVERSION CERAMIC
106A TAPERED SURFACE
108 REFLECTIVE LAYER
108A REFLECTIVE SURFACE
200 LIGHT EMITTING MODULE
202 SEMICONDUCTOR LIGHT EMITTING ELEMENT

BEST MODE FOR CARRYING OUT THE INVENTION

Preferred embodiments of the present invention will now be described in detail with reference to accompanying drawings.

First Embodiment

Figure 1:
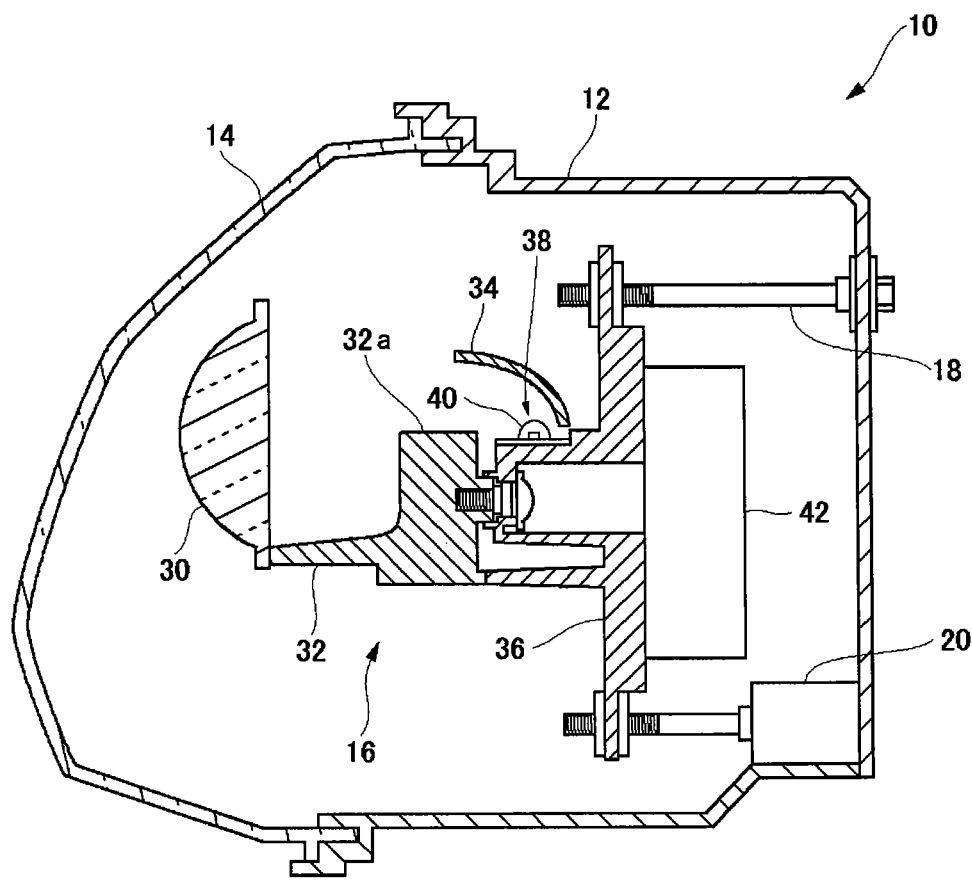
FIG. 1 is a sectional view illustrating the configuration of an automotive headlamp according to a first embodiment.

FIG. 1 is a sectional view illustrating the configuration of an automotive headlamp 10 according to a first embodiment. The automotive headlamp 10 has a lamp body 12, a front cover 14, and a lamp unit 16. Hereinafter, descriptions will be made, assuming that the left side in FIG. 1 is the front of the lamp and the right side therein is the back thereof. In addition, when viewing the front of the lamp, the right side is referred to as the right side of the lamp and the left side as the left side thereof. FIG. 1 illustrates the section of the automotive headlamp 10 cut by the vertical plane including the light axis of the lamp unit 16, when viewed from the left side of the lamp. When the automotive headlamp 10 is to be mounted in a vehicle, the automotive headlamps 10, which are formed symmetrically with each other, are provided in the left and right front portions of the vehicle, respectively. FIG. 1 illustrates the configuration of either of the left and right automotive headlamps 10.

The lamp body 12 is formed into a box shape having an opening. The front cover 14 is formed into a bowl shape with a resin having transparency or glass. The front cover 14 is installed such that the edge thereof is attached to the opening of the lamp body 12. In such a manner, a lamp chamber is formed in the area covered with the lamp body 12 and the front cover 14.

The lamp unit 16 is arranged in the lamp chamber. The lamp unit 16 is fixed to the lamp body 12 with aiming screws 18. The aiming screw 18 in the lower portion is configured to be rotatable by an operation of a leveling actuator 20. Accordingly, the light axis of the lamp unit 16 can be moved in the up-down direction by operating the leveling actuator 20.

The lamp unit 16 has a projection lens 30, a support member 32, a reflector 34, a bracket 36, a light emitting module substrate 38, and a radiating fin 42. The projection lens 30 is composed of a plano-convex aspheric lens, the front surface of which is convex-shaped and the back surface of which is flat-shaped, and projects a light source image that is formed on the back focal plane toward the front of the vehicle as an inverted image. The support member 32 supports the projection lens 30. A light emitting module 40 is provided on the light emitting module substrate 38. The reflector 34 reflects the light emitted from the light emitting module 40 to form the light source image on the back focal plane of the projection lens 30. As stated above, the reflector 34 and the projection lens 30 function as optical members that collect the light emitted by the light emitting module 40 toward the front of the lamp. The radiating fin 42 is installed onto the back surface of the bracket 36 to radiate the heat mainly generated by the light emitting module 40.

A shade 32a is formed on the support member 32. The automotive headlamp 10 is used as a light source for low-beam, and the shade 32a forms, in front of the vehicle, a cut-off line in the light distribution pattern for low-beam by shielding part of the light that has been emitted from the light emitting module 40 and reflected by the reflector 34. Because the light distribution pattern for low-beam is publicly known, descriptions thereof will be omitted.

Figure 2:
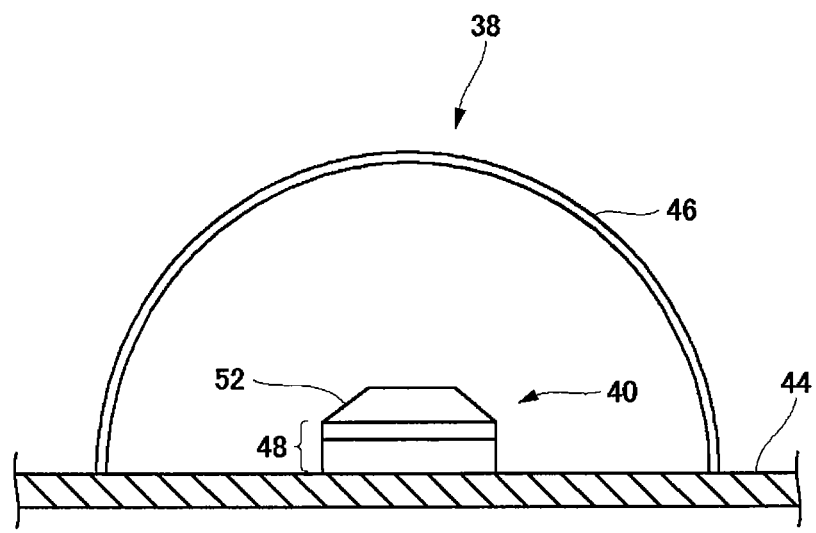
FIG. 2 is a view illustrating the configuration of a light emitting module substrate according to the first embodiment.

FIG. 2 is a view illustrating the configuration of the light emitting module substrate 38 according to the first embodiment. The light emitting module substrate 38 has the light emitting module 40, a substrate 44, and a transparent cover 46. The substrate 44 is a printed circuit board and the light emitting module 40 is attached to the upper surface of the substrate 44. The light emitting module 40 is covered with the colorless transparent cover 46. Accordingly, the inside of the transparent cover 46 becomes hollow. The light emitting module 40 has a semiconductor light emitting element 48 and light wavelength conversion ceramic 52, which is a light wavelength conversion member. The light wavelength conversion ceramic 52 is mounted on the upper surface of the semiconductor light emitting element 48.

Figure 3:
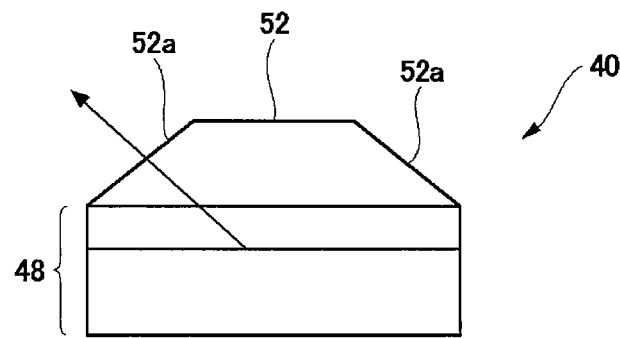
FIG. 3 is a view illustrating the configuration of a light emitting module according to the first embodiment.

FIG. 3 is a view illustrating the configuration of the light emitting module 40 according to the first embodiment. The semiconductor light emitting element 48 is composed of an LED element. In the first embodiment, a blue LED mainly emitting the light with a blue wavelength is adopted as the semiconductor light emitting element 48. Specifically, the semiconductor light emitting element 48 is composed of a GaN LED element that has been formed by subjecting a GaN semiconductor layer to crystal growth on a sapphire substrate. The semiconductor light emitting element 48 is formed as, for example, a square chip having a size of 1 mm×1 mm, and is provided such that the central wavelength of the emitted blue light is 470 nm. It is needless to say that the configuration of the semiconductor light emitting element 48 and the wavelength of the light to be emitted should not be limited to what have been stated above.

The light wavelength conversion ceramic 52 is so-called light emitting ceramic or fluorescent ceramic, and can be obtained by sintering the ceramic green body made of YAG (Yttrium Aluminum Garnet) powder that is a phosphor to be excited by blue light. Because a method of manufacturing such light wavelength conversion ceramic is publicly known, detailed descriptions thereof will be omitted.

The light wavelength conversion ceramic 52 thus obtained converts the wavelength of the blue light mainly emitted by the semiconductor light emitting element 48 and then emits yellow light. Accordingly, synthesized light that has been synthesized from both the blue light that has transmitted, as it is, the light wavelength conversion ceramic 52 and the yellow light whose wavelength has been converted by the light wavelength conversion ceramic 52, is emitted from the light emitting module 40. Thus, white light can be emitted from the light emitting module 40.

Transparent ceramic is adopted as the light wavelength conversion ceramic 52. The "to be transparent" in the first embodiment means that the total light transmittance of the light with a wavelength within the converted light-emitting wavelength range is 40 percent or more. As a result of the intensive research and development by the inventors, it has been found that, when the light wavelength conversion ceramic 52 is so transparent that the total light transmittance of the light with a wavelength within the converted light-emitting wavelength range is 40 percent or more, the wavelength of light can be properly converted by the light wavelength conversion ceramic 52 and a decrease in the light intensity of the light that is transmitting the light wavelength conversion ceramic 52 can also be properly suppressed. Accordingly, the light emitted by the semiconductor light emitting element 48 can be efficiently converted by making the light wavelength conversion ceramic 52 transparent as stated above.

The light wavelength conversion ceramic 52 is composed of an inorganic substance without binder such that the durability thereof is enhanced in comparison with the case where an organic substance, such as binder, is included. Accordingly, it becomes possible to supply the power of, for example, 1 W or more to the light emitting module 40, and thereby the luminance and light intensity of the light emitted by the light emitting module 40 can be enhanced.

Alternatively, a semiconductor light emitting element mainly emitting the light with a wavelength other than blue may be adopted as the semiconductor light emitting element 48. In this case, light wavelength conversion ceramic for converting the wavelength of the light mainly emitted by the semiconductor light emitting element 48 is also adopted as the light wavelength conversion ceramic 52. Also, in this case, the light wavelength conversion ceramic 52 may convert the wavelength of the light emitted by the semiconductor light emitting element 48 such that the light with a wavelength of white or close to white is emitted by combining with the light with the wavelength mainly emitted by the semiconductor light emitting element 48.

The light wavelength conversion ceramic 52 is formed into a plate shape. Part of the light emitted from the semiconductor light emitting element 48 travels obliquely toward the light emitting surface. For example, when the light wavelength conversion ceramic 52 is formed such that the section thereof has a rectangular shape, the part of the light travels obliquely toward the surface of the light wavelength conversion ceramic 52 as stated above, and hence there is the possibility that the light may return to the semiconductor light emitting element 48 by being reflected inside the light wavelength conversion ceramic 52. Because the semiconductor light emitting element 48 absorbs the light returning thereto by being reflected, the use efficiency of light is decreased.

Also, there is the light that is emitted outside from the end portion of the light wavelength conversion ceramic 52 by being reflected inside the light wavelength conversion ceramic 52 after traveling obliquely toward the surface thereof. However, because the possibility that the wavelength of the light traveling as stated above may be converted inside the light wavelength conversion ceramic 52 becomes high, the color of the light emitted from the end portion is greatly different from that of the light emitted from the upper surface, thereby causing the fear that a great color difference may be generated.

Accordingly, the light wavelength conversion ceramic 52 has a tapered surface 52a that slopes such that thickness thereof is reduced toward the end portion thereof. In the first embodiment, the tapered surface 52a slopes so as to be closer to the semiconductor light emitting element 48 toward the end portion. By providing the tapered surface 52a as stated above, the traveling angle of the light with respect to the surface of the light wavelength conversion ceramic 52 can also be made to be close to 90° even for the light that travels obliquely around the end portion, and hence the reflection of the light inside the light wavelength conversion ceramic 52 can be suppressed. Thereby, the light that will return to the semiconductor light emitting element 48 can be suppressed and the use efficiency of the light emitted by the semiconductor light emitting element 48 can be improved.

Further, by providing the tapered surface 52a as stated above, the light that may be emitted after being transmitted over a long distance of the inside of the light wavelength conversion ceramic 52 can be reduced. Accordingly, a color difference caused in the light emitted from the light wavelength conversion ceramic 52 can be suppressed.

In manufacturing the light emitting module 40, the tapered surface 52a that slopes such that the thickness thereof is reduced toward the end portion of the plate-shaped light wavelength conversion ceramic 52 is first provided. The tapered surface 52a can be provided by laser processing, etc. In addition, the tapered surface 52a may be provided during the molding of the light wavelength conversion ceramic 52. Subsequently, the surface opposite to the surface on which the tapered surface 52a is provided is attached to the upper surface (light emitting surface) of the semiconductor light emitting element 48. Thereby, the semiconductor light emitting element 48 and the light wavelength conversion ceramic 52 can be arranged such that the light emitted by the semiconductor light emitting element 48 is incident into the light wavelength conversion ceramic 52. In the light emitting module 40 according to the first embodiment, the plate-shaped light wavelength conversion ceramic 52 is used as stated above, and hence the tapered surface 52a can be easily provided.

Second Embodiment

Figure 4:
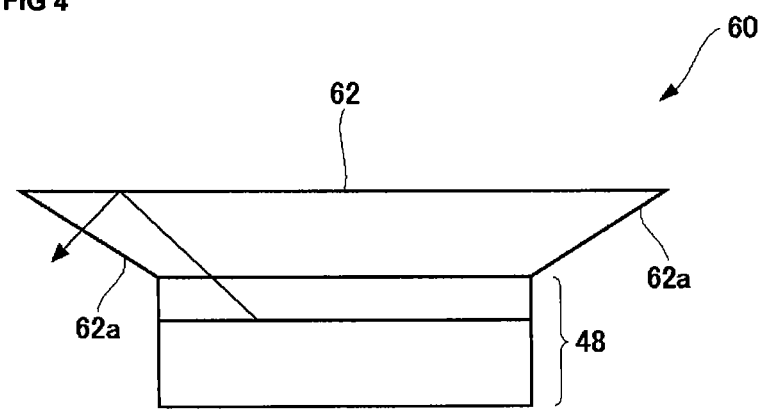
FIG. 4 is a view illustrating the configuration of a light emitting module according to a second embodiment.

FIG. 4 is a view illustrating the configuration of a light emitting module 60 according to a second embodiment. The configuration of the automotive headlamp 10 is the same as that in the first embodiment, except that the light emitting module 60 is provided instead of the light emitting module 40. Hereinafter, the parts similar to those in the first embodiment will be denoted with the same reference numerals and descriptions thereof will be omitted.

The configuration of the light emitting module 60 is the same as that of the aforementioned light emitting module 40, except that light wavelength conversion ceramic 62, which is a light wavelength conversion member, is provided instead of the light wavelength conversion ceramic 52. The light wavelength conversion ceramic 62 has a tapered surface 62a that slopes such that the thickness thereof is reduced toward the end portion thereof. In the second embodiment, the tapered surface 62a slopes so as to protrude in the direction where the light emitting surface is expanded more than the end portion of the semiconductor light emitting element 48 and to be away from the light emitting surface of the semiconductor light emitting element 48 toward the end portion of the light wavelength conversion ceramic 62. By providing the tapered surface 62a as stated above, the reflection of light inside the light wavelength conversion ceramic 62 can be suppressed in the same way as stated above. The light emitted from the tapered surface 62a travels obliquely downward. Accordingly, a reflective mirror configured to reflect the light upward may be provided around the tapered surface 62a.

In manufacturing the light emitting module 60, the tapered surface 62a is provided beforehand on the plate-shaped light wavelength conversion ceramic 62, and then the surface on which the tapered surface 62a is provided is attached to the upper surface of the semiconductor light emitting element 48. Also, in the second embodiment, the plate-shaped light wavelength conversion ceramic 62 is used as stated above, and hence the tapered surface 62a can be easily provided.

Third Embodiment

Figure 5:
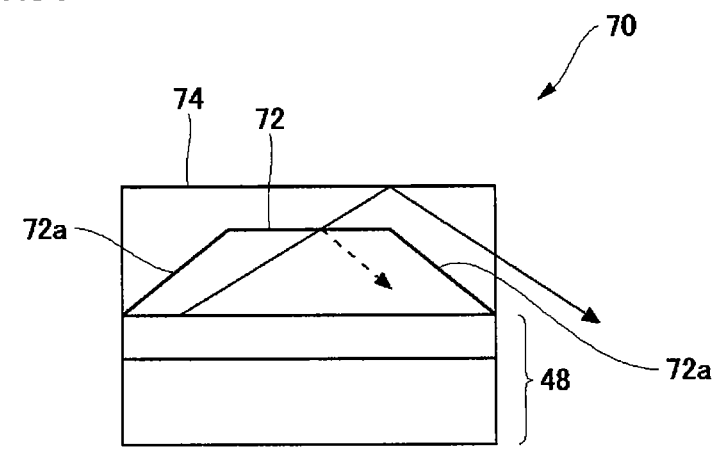
FIG. 5 is a view illustrating the configuration of a light emitting module according to a third embodiment.

FIG. 5 is a view illustrating the configuration of a light emitting module 70 according to a third embodiment. The configuration of the automotive headlamp 10 is the same as that in the first embodiment, except that the light emitting module 70 is provided instead of the light emitting module 40. Hereinafter, the parts similar to those in the aforementioned embodiments will be denoted with the same reference numerals and descriptions thereof will be omitted.

The configuration of the light emitting module 70 is the same as that of the aforementioned light emitting module 40, except that light wavelength conversion ceramic 72, which is a light wavelength conversion member, and transparent ceramic 74 are provided instead of the light wavelength conversion ceramic 52. The light wavelength conversion ceramic 72 is formed into the same shape as that of the light wavelength conversion ceramic 52 in the first embodiment. Accordingly, the light wavelength conversion ceramic 72 also has a tapered surface 72a that slopes so as to be closer to the semiconductor light emitting element 48 toward the end portion of the light wavelength conversion ceramic 72. The surface of the light wavelength conversion ceramic 72 opposite to the surface thereof on which the tapered surface 72a is provided is attached to the upper surface of the semiconductor light emitting element 48.

The transparent ceramic 74 is formed into a shape from which the shape of the light wavelength conversion ceramic 72 has been hollowed out; and attached to the upper portion of the light wavelength conversion ceramic 72 so as to be integrated by housing the light wavelength conversion ceramic 72 into the hollowed-out portion. By providing the transparent ceramic 74 as stated above, the reflection of light on the upper surface of the light wavelength conversion ceramic 72 can be suppressed as illustrated by the dashed line in FIG. 5. Thereby, the light that will return to the semiconductor light emitting element 48 can be reduced and the use efficiency of light can be improved.

In addition, a reflective mirror configured to reflect upward the light emitted from the end portion of the transparent ceramic 74 may be provided around the light emitting module 70. Alternatively, a transparent member made of a material other than ceramic may be integrally attached to the upper surface of the light wavelength conversion ceramic 72, instead of the transparent ceramic 74.

Fourth Embodiment

FIG. 6 is a view illustrating the configuration of a light emitting module 80 according to a fourth embodiment. The configuration of the automotive headlamp 10 is the same as that in the first embodiment, except that the light emitting module 80 is provided instead of the light emitting module 40. Hereinafter, the parts similar to those in the aforementioned embodiments will be denoted with the same reference numerals and descriptions thereof will be omitted.

The configuration of the light emitting module 80 is the same as that of the aforementioned light emitting module 40, except that a ceramic unit 82 is provided instead of the light wavelength conversion ceramic 52. The ceramic unit 82 has light wavelength conversion ceramic 84, which is a light wavelength conversion member, and a reflective layer 86.

The light wavelength conversion ceramic 84 has a tapered surface 84a that slopes such that the thickness thereof is reduced toward the end portion thereof. In the fourth embodiment, the tapered surface 84a slopes so as to protrude in the direction where the light emitting surface is expanded more than the end portion of the semiconductor light emitting element 48 and to be away from the light emitting surface of the semiconductor light emitting element 48 toward the end portion of the light wavelength conversion ceramic 84. The reflective layer 86 is provided on the tapered surface 84a. The reflective layer 86 may be formed by attaching a reflective mirror to the tapered surface 84a, or may be formed by subjecting the tapered surface 84a to a mirror finish, for example, such as aluminum evaporation, etc. In the reflective layer 86, a reflective surface 86a is formed on the portion in contact with the tapered surface 84a.

In manufacturing the light emitting module 80, the tapered surface 84a is first provided on the plate-shaped light wavelength conversion ceramic 84. Subsequently, the reflective layer 86 is provided on the tapered surface 84a to form the ceramic unit 82. The ceramic unit 82 is attached to the semiconductor light emitting element 48 by fixing the surface of the light wavelength conversion ceramic 84, on which the tapered surface 84a is provided, to the upper surface of the semiconductor light emitting element 48 with adhesion, etc.

In the light emitting module 80 thus manufactured, the light that has traveled obliquely around the end portion of the light wavelength conversion ceramic 84 and is to be emitted from the reflective surface 86a, of the light emitted from the semiconductor light emitting element 48, is emitted toward above the light emitting module 80 by the reflective surface 86a. By providing the reflective layer 86 on the tapered surface 84a as stated above, the use efficiency of light can be improved and much light can be emitted toward above the light emitting module 80.

Fifth Embodiment

FIG. 7 is a view illustrating the configuration of a light emitting module 90 according to a fifth embodiment. The configuration of the automotive headlamp 10 is the same as that in the first embodiment, except that the light emitting module 90 is provided instead of the light emitting module 40. Hereinafter, the parts similar to those in the aforementioned embodiments will be denoted with the same reference numerals and descriptions thereof will be omitted.

The configuration of the light emitting module 90 is the same as that of the aforementioned light emitting module 40, except that a ceramic unit 92 is provided instead of the light wavelength conversion ceramic 52. The ceramic unit 92 has light wavelength conversion ceramic 94, which is a light wavelength conversion member, and a reflective layer 96.

The light wavelength conversion ceramic 94 has a tapered surface 94a that slopes such that the thickness thereof is reduced toward the end portion thereof. In the fourth embodiment, the tapered surface 94a slopes so as to protrude in the direction where the light emitting surface is expanded more than the end portion of the semiconductor light emitting element 48 and to be away from the light emitting surface of the semiconductor light emitting element 48 toward the end portion of the light wavelength conversion ceramic 94. The reflective layer 96 is provided on the tapered surface 94a. The reflective layer 96 may be formed by attaching a reflective mirror to the tapered surface 94a, or may be formed by subjecting the tapered surface 94a to, for example, the aforementioned mirror finish. In the reflective layer 96, a reflective surface 96a is formed on the portion in contact with the tapered surface 94a.

In manufacturing the light emitting module 90, the tapered surface 94a is first provided on the plate-shaped light wavelength conversion ceramic 94. A concave portion from which the shape of the semiconductor light emitting element 48 has been hollowed out as it is by, for example, etching or laser processing, is formed on the surface on which the tapered surface 94a is provided. The ceramic unit 92 is formed by providing the reflective layer 96 on the tapered surface 94a. Subsequently, the ceramic unit 92 is attached to the semiconductor light emitting element 48 by housing the semiconductor light emitting element 48 into the concave portion formed in the light wavelength conversion ceramic 94 and by fixing them with adhesion, etc.

In the light emitting module 90 thus manufactured, the light that has traveled obliquely around the end portion of the light wavelength conversion ceramic 94 and is to be emitted from the reflective surface 96a, of the light emitted from the semiconductor light emitting element 48, is emitted toward above the light emitting module 90 by the reflective surface 96a. By providing the reflective layer 96 on the tapered surface 94a as stated above, the use efficiency of light can be improved and much light can be emitted toward above the light emitting module 90.

Sixth Embodiment

Figure 8:
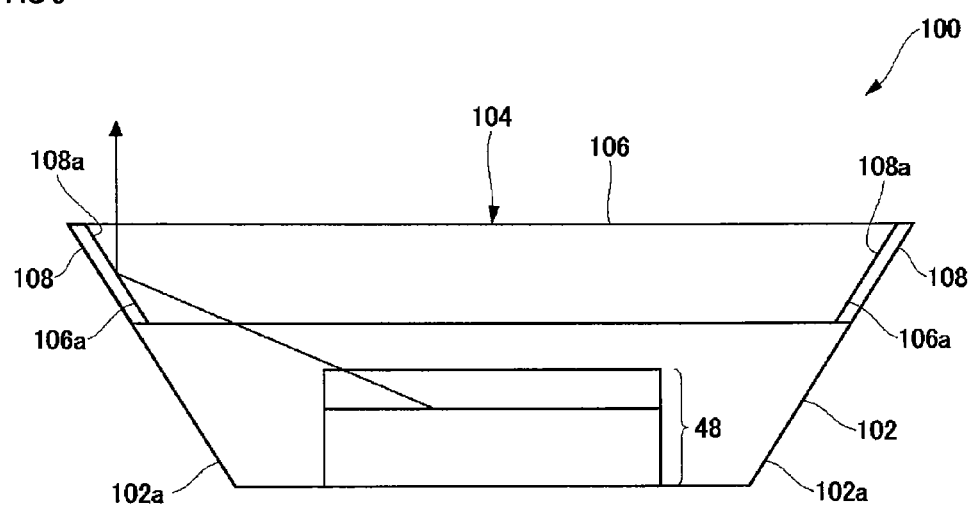
FIG. 8 is a view illustrating the configuration of a light emitting module according to a sixth embodiment.
Figure 9:
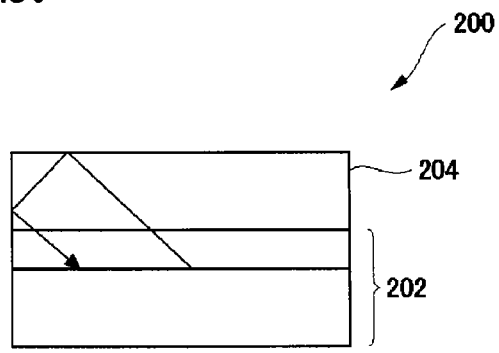
FIG. 9 is a view illustrating an example of the path of light in a light emitting module in which light wavelength conversion ceramic whose section has a rectangular shape is mounted on the upper surface of a semiconductor light emitting element.

FIG. 8 is a view illustrating the configuration of a light emitting module 100 according to a sixth embodiment. The configuration of the automotive headlamp 10 is the same as that in the first embodiment, except that the light emitting module 100 is provided instead of the light emitting module 40. Hereinafter, the parts similar to those in the aforementioned embodiments will be denoted with the same reference numerals and descriptions thereof will be omitted.

The configuration of the light emitting module 100 is the same as that of the aforementioned light emitting module 40, except that transparent ceramic 102 and a ceramic unit 104 are provided instead of the light wavelength conversion ceramic 52.

The transparent ceramic 102 is formed into a plate shape and a tapered surface 102a is provided around the end portion thereof. A concave portion from which the shape of the semiconductor light emitting element 48 has been hollowed out as it is, is formed on the surface of the transparent ceramic 102 on which the tapered surface 102a is provided.

The ceramic unit 104 has light wavelength conversion ceramic 106, which is a light wavelength conversion member, and a reflective layer 108. The light wavelength conversion ceramic 106 has a tapered surface 106a that slopes such that the thickness thereof is reduced toward the end portion thereof. In the sixth embodiment, the tapered surface 106a slopes so as to protrude in the direction where the light emitting surface is expanded more than the end portion of the semiconductor light emitting element 48 and to be away from the semiconductor light emitting element 48 toward the end portion of the ceramic unit 104. The reflective layer 108 is provided on the tapered surface 106a. The reflective layer 108 may be formed by attaching a reflective mirror to the tapered surface 106a, or may be formed by subjecting the tapered surface 106a to the aforementioned mirror finish. In the reflective layer 108, a reflective surface 108a is formed on the portion in contact with the tapered surface 106a.

In manufacturing the light emitting module 100, the tapered surface 102a is first provided on the transparent ceramic 102. Of the transparent ceramic 102, a concave portion from which the shape of the semiconductor light emitting element 48 has been hollowed out as it is by, for example, etching or laser processing, is formed on the surface on which the tapered surface 102a is provided. Subsequently, the tapered surface 106a is provided on the plate-shaped light wavelength conversion ceramic 106, and the reflective layer 108 is provided on the tapered surface 106a to form the ceramic unit 104.

The transparent ceramic 102 is first attached to the semiconductor light emitting element 48 by housing the semiconductor light emitting element 48 into the concave portion formed in the transparent ceramic 102 and by fixing them with adhesion, etc. Subsequently, the surface of the light wavelength conversion ceramic 106 on which the tapered surface 106a is provided is fixed to the upper surface of the transparent ceramic 102 with adhesion, etc. The ceramic unit 104 is attached to the transparent ceramic 102 as stated above.

In the light emitting module 100 thus manufactured, the light that has traveled obliquely around the end portion of the light wavelength conversion ceramic 106 and is to be emitted from the reflective surface 108a, of the light emitted from the semiconductor light emitting element 48, is emitted toward above the light emitting module 100 by the reflective surface 108a. By providing the reflective layer 108 on the tapered surface 106a as stated above, the use efficiency of light can be improved and much light can be emitted toward above the light emitting module 100.

The present invention should not be limited to the above embodiments, and variations in which each component of the embodiments is appropriately combined are also effective as embodiments of the invention. Various modifications, such as design modifications, can be made with respect to the above embodiments based on the knowledge of those skilled in the art. Such modified embodiments can also fall in the scope of the invention.

In a variation, an optical filter is provided between the semiconductor light emitting element 48 and the light wavelength conversion ceramic. The optical filter transmits the blue light mainly emitted by the semiconductor light emitting element 48. In addition, the optical filter reflects the yellow light mainly emitted by the light wavelength conversion ceramic that converts the wavelength of the blue light. Most of the light emitted by the semiconductor light emitting element 48 can be first emitted to the light wavelength conversion ceramic by arranging the optical filter between the semiconductor light emitting element 48 and the light wavelength conversion ceramic. Further, the light with a yellow wavelength travelling toward the semiconductor light emitting element, occurring due to the diffusion of light when the wavelength of the light is converted by the light wavelength conversion ceramic, can be reflected. Accordingly, the light emitted by the semiconductor light emitting element 48 can be used efficiently, and thereby a decrease in the light intensity or luminance of the light emitted by the light emitting module 40 can be suppressed.

The optical filter may be composed of a multi-layered dichroic mirror that has been formed by alternately depositing and laminating materials having refractive indexes different from each other on one surface of the light wavelength conversion ceramic. Alternatively, for example, a long pass filter, short pass filter, or band pass filter may be adopted.

INDUSTRIAL APPLICABILITY

According to the present invention, the use efficiency of light by a light wavelength conversion member can be improved in a light emitting module.

The invention claimed is:

1. A light emitting module comprising:
a light emitting element; and
a plate-shaped light wavelength conversion ceramic configured to convert a wavelength of a light emitted by the light emitting element and to emit the light,
the light wavelength conversion ceramic having a tapered surface that slopes such that a thickness of the light wavelength conversion ceramic is reduced toward an end portion of the light wavelength conversion ceramic; and
a transparent member formed with a concave portion from which a shape of the light wavelength conversion ceramic is hollowed out, wherein
the light wavelength conversion ceramic is mounted on an upper surface of the light emitting element, and
the transparent member is attached to an upper portion of the light wavelength conversion ceramic so as to house the light wavelength conversion ceramic in the concave portion.

2. The light emitting module according to claim 1, wherein the light wavelength conversion ceramic is transparent.

3. The light emitting module according to claim 2, wherein the light wavelength conversion ceramic has 40 percent or more of the total light transmittance of the light with a wavelength within the converted light-emitting wavelength range.

4. The light emitting module according to claim 1, wherein the tapered surface slopes so as to be closer to the light emitting element toward the end portion of the light wavelength conversion ceramic.

5. The light emitting module according to claim 1, wherein the tapered surface slopes so as to be away from the light emitting element toward the end portion of the light wavelength conversion ceramic.

6. A lamp unit comprising:
the light emitting module according to claim 1; and
an optical member configured to collect the light emitted from the light emitting module.

7. A light emitting module comprising:
a light emitting element;
a plate-shaped light wavelength conversion ceramic configured to convert a wavelength of a light emitted by the light emitting element and to emit the light, the light wavelength conversion ceramic having a tapered surface that slopes such that a thickness of the light wavelength conversion ceramic is reduced toward an end portion of the light wavelength conversion ceramic and having a concave portion from which a shape of the light emitting element is hollowed out; and
a reflective layer provided on the tapered surface and configured to reflect the light to be emitted from the light wavelength conversion ceramic, wherein
the light emitting element is housed in the concave portion formed in the light wavelength conversion ceramic.

8. The light emitting module according to claim 7, wherein the tapered surface slopes so as to be closer to the light emitting element toward the end portion of the light wavelength conversion ceramic.

9. The light emitting module according to claim 7, wherein the tapered surface slopes so as to be away from the light emitting element toward the end portion of the light wavelength conversion ceramic.

10. A lamp unit comprising:
the light emitting module according to claim 7; and
an optical member configured to collect the light emitted from the light emitting module.

11. A light emitting module comprising:
a light emitting element;
a plate-shaped light wavelength conversion ceramic configured to convert a wavelength of a light emitted by the light emitting element and to emit the light, the light wavelength conversion ceramic having a tapered surface that slopes such that a thickness of the light wavelength conversion ceramic is reduced toward an end portion of the light wavelength conversion ceramic;
a transparent member formed with a concave portion from which a shape of the light emitting element is hollowed out; and
a reflective layer provided on the tapered surface and configured to reflect the light to be emitted from the light wavelength conversion ceramic, wherein
the light emitting element is housed in the concave portion formed in the transparent member, and
the light wavelength conversion ceramic is mounted on the upper surface of the transparent member.

12. The light emitting module according to claim 11, the tapered surface slopes so as to be closer to the light emitting element toward the end portion of the light wavelength conversion ceramic.

13. The light emitting module according to claim 11, wherein
the tapered surface slopes so as to be away from the light emitting element toward the end portion of the light wavelength conversion ceramic.

14. A lamp unit comprising:
the light emitting module according to claim 11; and
an optical member configured to collect the light emitted from the light emitting module.

* * * * *